United States Patent [19]

Tserng

[11] 4,050,032

[45] Sept. 20, 1977

[54] AVALANCHE DIODE AMPLIFIER

[75] Inventor: Hua Quen Tserng, Dallas, Tex.

[73] Assignee: Texas Instruments Incorporated, Dallas, Tex.

[21] Appl. No.: 646,314

[22] Filed: Jan. 2, 1976

[51] Int. Cl.² .............................................. H03F 3/10
[52] U.S. Cl. ...................................... 330/34; 330/53; 330/61 A
[58] Field of Search .................... 330/4.9, 5, 34, 53, 330/61 A; 333/1.1

[56] References Cited

U.S. PATENT DOCUMENTS

| 3,248,662 | 4/1966 | Brownell et al. | 330/34 X |
| 3,456,213 | 7/1969 | Hershenov | 333/1.1 |
| 3,490,053 | 1/1970 | Nagai et al. | 333/1.1 |
| 3,636,465 | 1/1972 | MacPherson | 330/34 X |
| 3,895,308 | 7/1975 | Lee et al. | 330/53 X |

FOREIGN PATENT DOCUMENTS

| 1,912,852 | 10/1970 | Germany | 330/34 |

OTHER PUBLICATIONS

Welch, "Beam Lead Tunner Diode Amplifiers on Microstrip", *IEEE Transactions on Microwave Theory and Techniques*, vol. MTT-18, No. 12, Dec. 1970, pp. 1077-1083.

*Primary Examiner*—James B. Mullins
*Attorney, Agent, or Firm*—Harold Levine; James T. Comfort; James J. Elacqua

[57] ABSTRACT

A microwave amplifier is disclosed using a nonreciprocal three port junction circulator. The amplifier uses a ferrite circulator having an input port, an output port and a third electrical port. A semiconductor device such as an IMPATT diode having negative resistance is located adjacent and electrically coupled to the third electrical port. The negative resistance of the IMPATT diode combines with the output response of the third electrical port of the circulator to provide power amplification of microwave signals received on the input port.

1 Claim, 4 Drawing Figures

AVALANCHE DIODE AMPLIFIER

The invention described herein was made in the course of, or under a contract with the Department of the Navy.

This invention is directed to a microwave amplifier and more particularly to a nonreciprocal three port junction circulator.

Nonreciprocal microwave ferrite circulators are generally used for reflection type negative resistance microwave amplifiers. The realization of nonreciprocal microwave ferrite devices stems from the ferromagnetic behavior of the elementary magnetic dipoles of ferrite materials. The three port version is usually called the Y junction circulator. The Y junction circulator is a nonreciprocal device providing transmission of energy from one of its ports to an adjacent port while decoupling the signal from all other ports. In a microwave amplifier constructed from a Y junction circulator, the RF input energy is applied to one port with a negative resistance device such as an IMPATT or Schottky-Read diode applying a gain to the second port with the output from the third port.

A ferrite element is placed in the center of three symmetrical junctions spaced 120° apart. Circulator action is obtained by biasing the ferrite element in the actual direction with an internal static field of proper magnitude. The static magnetic field applied into the plane of the circulator causes a standing wave to rotate clockwise.

In the prior art, the negative resistance device is connected to the second port through an equalization network instead of between the circulator output of the second port and the negative resistance device. The equalization or coupling network is used to transform the output impedance of the circulator to the appropriate level at the device terminal. If large signal parametric instabilities are to be avoided in such a device, care must be exercised to present the right harmonic impedances.

It is therefore an object of this invention to provide a new and improved Avalanche Diode Amplifier. Another object of this invention is to provide a new and improved Avalanche Diode Amplifier using a nonreciprocal three port junction circulator.

Figure 1:
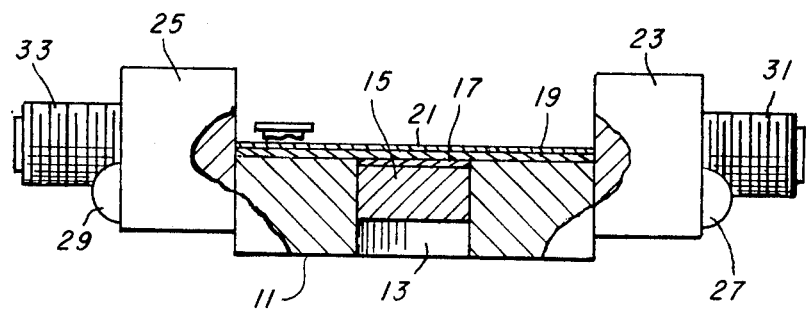
FIG. 1 shows a cut-away view of a reflection type microwave amplifier constructed according to this invention.

Referring now to FIG. 1, a housing 11 of metallic nonmagnetic material has a circular hole 13 having a diameter of approximately 0.25 inches drilled through the housing 11. A permanent bias magnet 15 is inserted in the hole 13. The permanent magnet 15 is approximately 0.1 inches thick. A non-magnetic shim 17 of approximately 35 mils thick is inserted above the permanent magnet 15 with a ferrite substrate 19 deposited over the hole and over the supporting member 11. A metallic pattern 21 of gold, for instance, is deposited on the ferrite substrate in the pattern shown in FIG. 2. This metallic pattern is designated generally by the numeral 21. Two connector housings, 23 and 25, are attached to the supporting block 11 by screws 27 and 29, respectively. The input and output connections are made by screwing the connectors onto screw inputs 31 and 33 and bonding the connectors to the metallic pattern 21.

Figure 2:
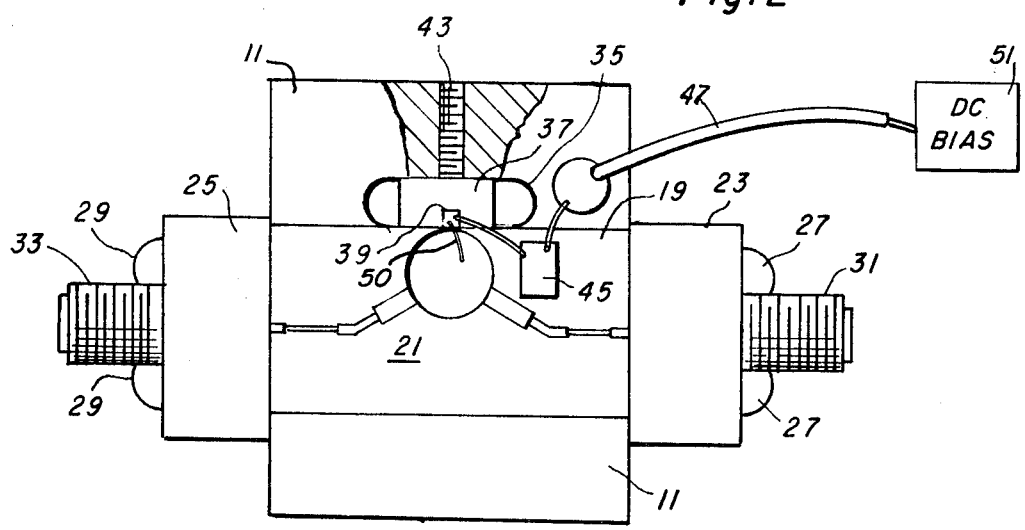
FIG. 2 shows a view from the top of a nonreciprocal three port junction circulator constructed according to the principles of this invention.

Referring now to FIG. 2, for a plan view of the device, the numerals applied to the corresponding parts shown in FIG. 1 apply to the same parts of the device shown in FIG. 2. A recess 35 is machined in the support block 11. A nonmagnetic support block 37 with an IMPATT diode 39 mounted thereon is inserted into recess 35. The support block 37 is held in place in recess 35 by a set screw 43.

The IMPATT diode 39 is bonded with a bonding wire 50 directly to one port of the circulator junction 21 without any equalization network. The metallic pattern 21 forming the circulator is deposited on the ferrite substrate 19 by well known techniques. The circulator designs have a real part of the junction impedance on the order of 10–20 ohms.

The specific circulator shown uses IMPATT diodes while Schottky-Read diodes may also be used. A DC bias 51 is provided for diode 39 by a connection to deposited contact 45 to a pin 47 to which a wire is bonded.

The circulator has the following characteristics:

1. Wide bandwidth (1–2 GHz);
2. Minimum dimension (no matching network required);
3. No parametric instabilities under all drive levels (input power as high as 5 watts has been used with no detectable parametric oscillation);
4. Frequency tuning can be achieved by simple bond-wire adjustments;
5. Tuning can also be achieved by adjustment of the magnetic field (since the circulation impedance depends on the bias field); and
6. The real part of the impedance can be reduced below 10Ω, if desired, by reducing the thickness of the ferrite.

Figure 3:
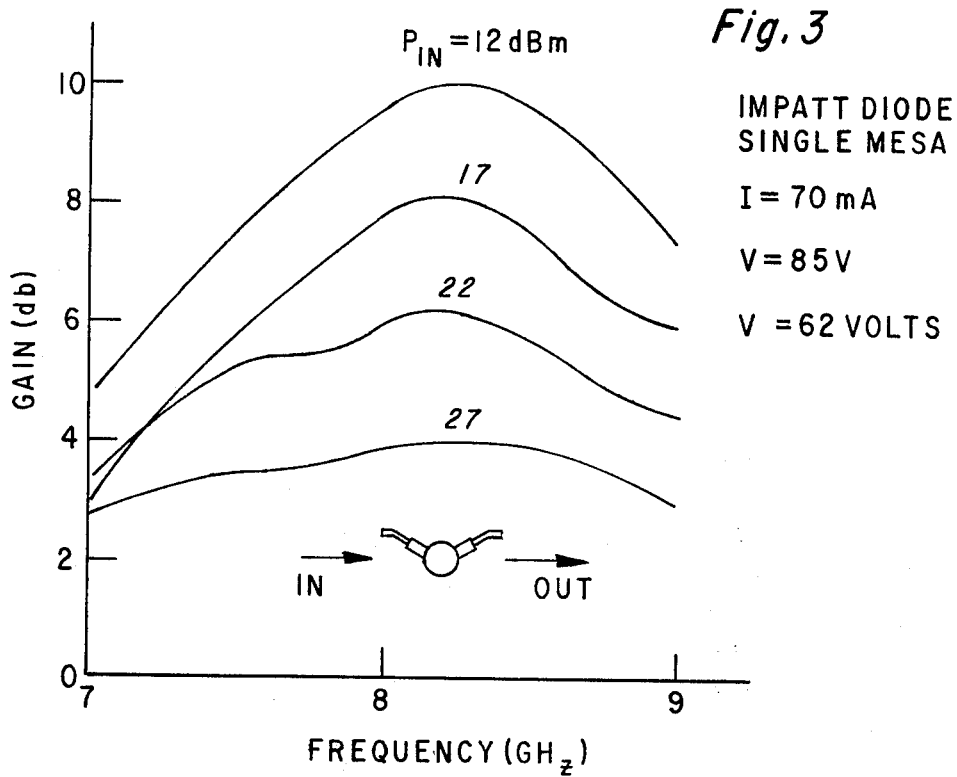
FIG. 3 shows the gain frequency response of the amplifier.

FIG. 3 shows a gain-frequency response of the novel IMPATT amplifier with a single-mesa diode (Diameter - 4.5 mils). The unpackaged diode is mounted on a gold-plated copper block attached to one port of the circulator. A one-mil gold wire was used to achieve the desired center frequency. Two-mesa and four-mesa diodes have also operated successfully in this simple scheme with higher output power. In each case, the amplifier can be driven into hard saturation without any parametric effects. The dc to RE conversion efficiency is similar to that operated as oscillators in the conventional waveguide circuit.

In addition to the flat profile IMPATT diodes, Schottky-Read diodes of low-high-low or high-low structures have also been tested in the simple amplifier configuration. Because of the lower Q of the schottky-Read diodes, an amplifier with wider bandwidth is possible. Output power of 4–5 watts with 3–4 db gain and efficiencies exceeding 20% have also been achieved using this novel circulator.

Although the specific circulator design covers the frequency range 7–9.5 Ghz, it can be scaled to other frequencies. For example, the circulator used for higher frequencies could be used to cover the frequency range 8–11 GHz.

Figure 4:
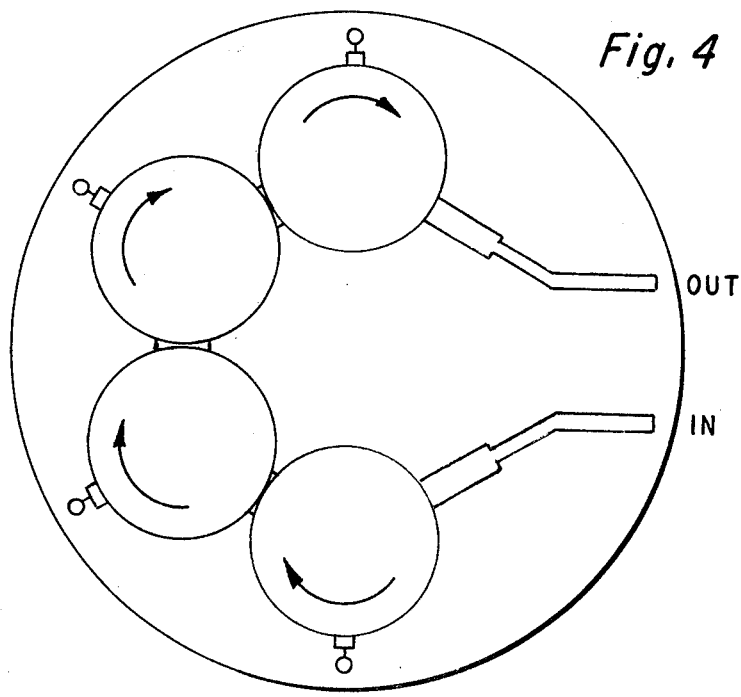
FIG. 4 shows a multi-stage amplifier.

Other possible applications for the novel amplifier include the following:

1. Simple, miniaturized multi-stage IMPATT or Schottky-Read amplifiers such as a four-stage amplifier with input/output isolation. Either distributed dc block or discrete capacitors can be used in the common arm for dc isolation; and 2. FIG. 4 shows another possible multi-stage IMPATT or Schottky-Read amplifier configuration. All the circulators are arranged such that they are tangential to each other at the output and input port respectively. The transformation to the 50Ω line is then eliminated. Either a single magnet or individual magnets can be used for this configuration.

The diodes can be selected such that the amplifier can be operated on a common power supply. Chip capacitors can also be used between the circulators for dc isolation.

What is claimed is:

1. A microwave amplifier comprising:
   a. a housing of non-magnetic metallic material having a recess and an opening at the center thereof, and in juxtaposition to each other,
   b. a permanent bias magnet disposed in the opening of said housing,
   c. a non-magnetic shim covering the top surface of said permanent bias magnet,
   d. a ferrite substrate extending across the surface of said metallic housing and said non-magnetic shim,
   e. a metallic circulator disposed on said ferrite substrate having an input port, an output port and a third electrical port,
   f. a non-magnetic support block disposed in said recess of said housing and located adjacent to said third electrical port of said metallic circulator,
   g. a diode mounted on said non-magnetic support block,
   h. a bonding wire extending between said diode and said third electrical port of said metallic circulator and connected therebetween,
   i. a pair of connector housings attached to said metallic housing, and
   j. means bonding said pair of connector housings to the input and output ports of said metallic circulator.

* * * * *